(12) United States Patent
Chandrasekar et al.

(10) Patent No.: US 10,770,443 B2
(45) Date of Patent: Sep. 8, 2020

(54) CLOCK ARCHITECTURE IN HETEROGENEOUS SYSTEM-IN-PACKAGE

(71) Applicant: Intel Corporation, Santa Clara, CA (US)

(72) Inventors: Karthik Chandrasekar, San Jose, CA (US); Shreepad Panth, San Jose, CA (US); Ravi Prakash Gutala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 16/146,716

(22) Filed: Sep. 28, 2018

(65) Prior Publication Data

US 2020/0105732 A1    Apr. 2, 2020

(51) Int. Cl.
*H01L 25/18* (2006.01)
*H01L 23/00* (2006.01)
*H03L 7/081* (2006.01)
*H03K 19/17796* (2020.01)
*H01L 23/538* (2006.01)

(52) U.S. Cl.
CPC .......... *H01L 25/18* (2013.01); *H01L 23/5381* (2013.01); *H01L 24/16* (2013.01); *H01L 24/17* (2013.01); *H03K 19/17796* (2013.01); *H03L 7/0812* (2013.01); *H01L 2224/16145* (2013.01); *H01L 2224/16225* (2013.01); *H01L 2224/17181* (2013.01); *H01L 2924/1431* (2013.01)

(58) Field of Classification Search
CPC ......... H01L 25/18; H01L 24/17; H01L 24/16; H01L 23/5381; H01L 2924/1431; H01L 2224/17181; H01L 2224/16145; H01L 2224/16225; H03L 7/0812; H03K 19/17796
USPC .......................................................... 326/93
See application file for complete search history.

(56) References Cited

U.S. PATENT DOCUMENTS

| | | | |
|---|---|---|---|
| 7,423,467 B1 | 9/2008 | Simon | |
| 9,543,965 B1 | 1/2017 | Ding | |
| 2007/0103204 A1* | 5/2007 | Egan | H03M 9/00 327/100 |
| 2014/0132305 A1* | 5/2014 | Gaide | H03K 19/096 326/93 |
| 2018/0308826 A1* | 10/2018 | Kawaminami | H01L 25/50 |
| 2019/0044515 A1* | 2/2019 | Gutala | H01L 25/0652 |

* cited by examiner

*Primary Examiner* — Don P Le
(74) *Attorney, Agent, or Firm* — Fletcher Yoder PC

(57) ABSTRACT

An integrated circuit device that may include programmable logic fabric disposed on an integrated circuit die and a base die that may include clocking circuitry. Synchronization between logic resources in the programmable logic fabric may be performed using clock signals received from the clocking circuitry. The clocking circuitry in the base die may include phase-locked loops, delay-locked loops, clock trees, and other similar circuitry.

22 Claims, 10 Drawing Sheets

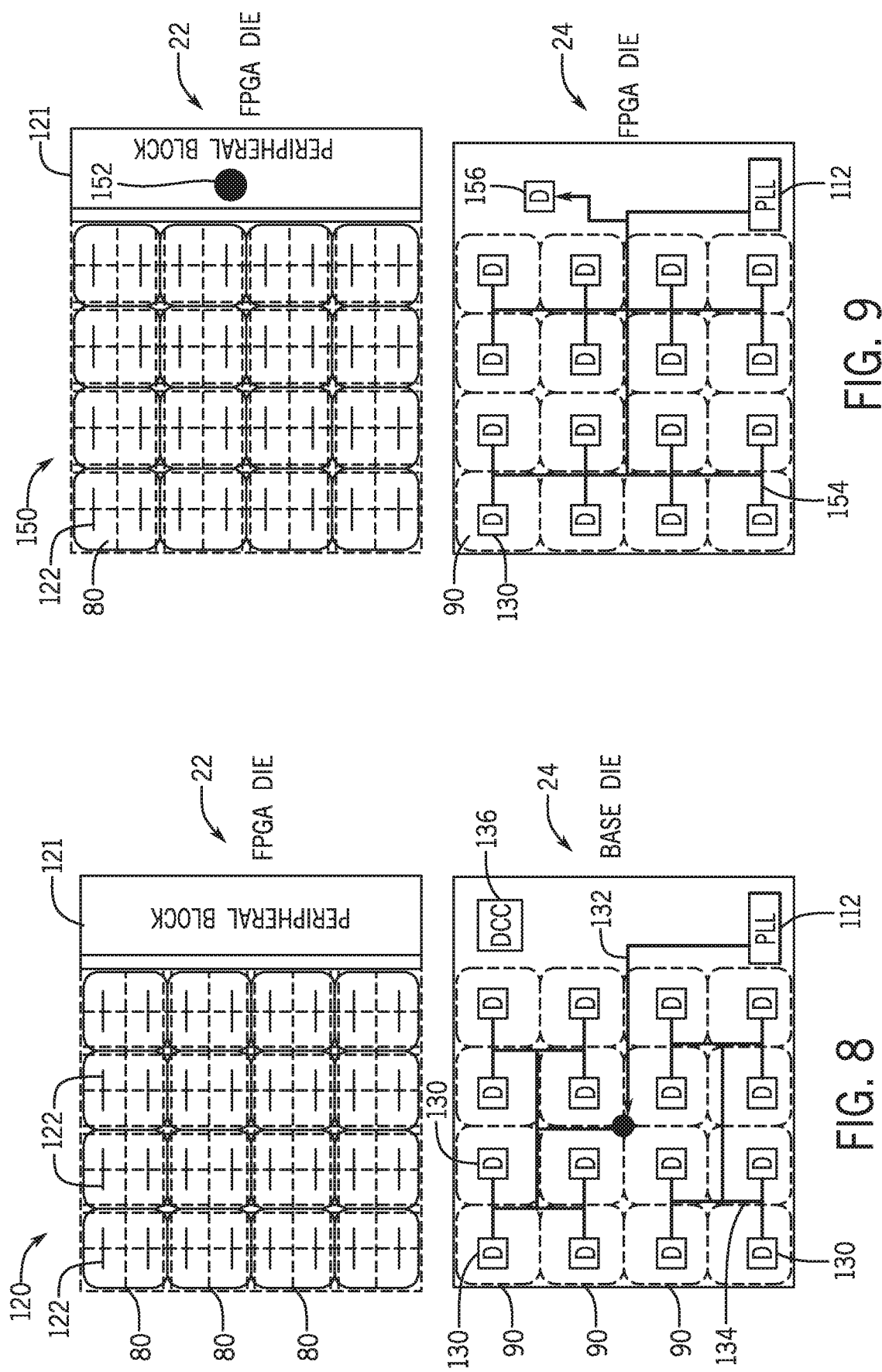

CLOCK ARCHITECTURE IN HETEROGENEOUS SYSTEM-IN-PACKAGE

BACKGROUND

This disclosure relates to the use of active interposer circuitry in a base die to provide clocking signals in a multi-dimensional die packaging.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed that may be programmed to perform custom operations or to implement a circuit design. To program custom operations and/or circuit design into a programmable logic device, the circuit design may be compiled into a bitstream and programmed into configuration memory in the programmable logic device. The values programmed using the bitstream define the operation of programmable logic elements of the programmable logic device. Programmable logic devices may be used to implement synchronous operations. In such situations, synchronization between different areas of the programmable logic device die may be obtained by a clock distribution network, or clock tree. As dimensions of programmable logic devices increase, design of clock trees become challenging.

BRIEF DESCRIPTION OF THE DRAWINGS

Various aspects of this disclosure may be better understood upon reading the following detailed description and upon reference to the drawings in which:

FIG. 8 is a block diagram illustrating a clock tree in a base die and a relationship between the base die and circuitry in a programmable fabric die;

FIG. 9 is a block diagram illustrating a clock tree in a base die and a relationship between the base die and circuitry in a programmable fabric die with a peripheral block;

DETAILED DESCRIPTION OF SPECIFIC EMBODIMENTS

Figure 1:
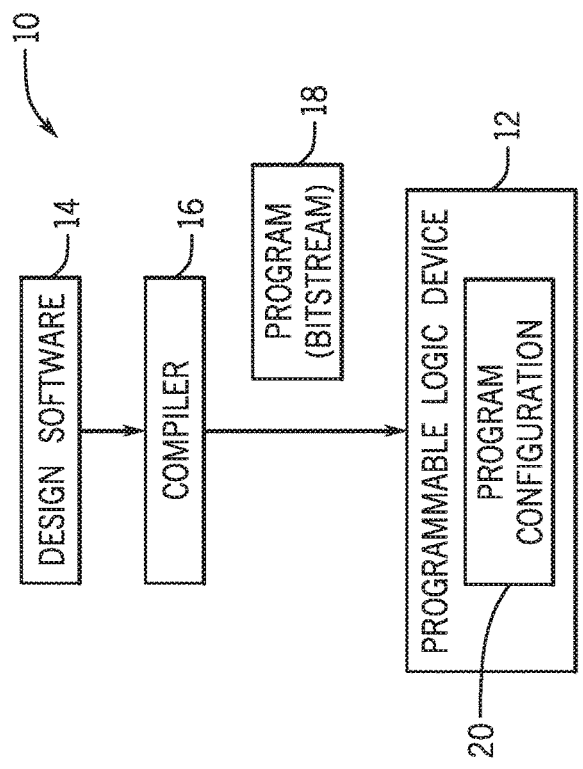
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. In certain embodiments, as different sectors, portions, or regions of a programmable logic device are used to perform different operations, it may be useful to have synchronization in the timing of the operations taking place in the multiple sectors (e.g., regions). To that end, clock networks or clock trees may be used. In general, clock trees may be used to provide a synchronized clock signal to various circuit elements (e.g., registers, memory elements) from a common clock source. However, due to the dimensions of data lines in larger programmable logic devices and/or multi-die programmable logic devices, the skews in the clock signal between various registers may increase. The use of larger and/or more powerful clock tree circuitry or clock may occupy substantial amount of space of the programmable fabric die.

With the foregoing in mind, the present application discusses systems and methods of operation thereof that may employ active interposer circuitry in a base die for implementing and providing clock distribution networks. Embodiments described herein may include programmable fabric die synchronized through a clock tree in the base die. Embodiments may employ multi-dimensional interfaces (e.g., 2.5D interfaces, 3D interfaces) for transmission of clock signals between the base die and the programmable fabric die. The base die may also provide clock signals for other circuitry such as hardened logic die, communication circuitry (e.g., transceiver circuitry), memory devices, processors, application-specific integrated circuits (ASICs), or other integrated circuits (ICs). As described herein, logic die may refer to programmable fabric die, hardened logic die, processors and similar integrated circuits capable of performing logic operations.

With this in mind, the present application discusses systems and methods of operation thereof that may include a programmable logic device. In certain embodiments, the programmable logic device may be composed of at least two separate die. The programmable logic device may include a first die that contains primarily programmable logic fabric, and a second die that contains fabric support circuitry to support the operation of the programmable logic fabric. For example, the second die may contain at least some fabric support circuitry that may operate the programmable logic fabric (e.g., the fabric support circuitry of the second die may be essential to the operation of the programmable logic fabric of the first die).

In certain embodiments, clocking circuitry, such as phase locked loops (PLLs), delay locked loops (DLLs), and/or clock distribution networks or clock trees may be embedded on second die that includes the fabric support circuitry. Clocking circuitry may facilitate coordination of operations between sectors (e.g., regions, portions) on the second die, between sectors on the first die, between sectors on the first die and the second die, and the like. The presence of the clocking circuitry in the second die may decrease the presence of imbalanced clock trees in sectors of the first die, thus reducing clock signal skews, increasing timing margins, and facilitating timing closure during the design of the programmable logic array. Moreover, incorporating the clocking circuitry into the fabric support circuitry may increase available floorplan space in the first die, allowing for the presence of more programmable fabric. Certain embodiments may also improve the signal integrity of the clock signals, as a result of the reduction of noise coupling between clock tree circuitry and dense data lines (e.g., clock tree in the second die may be decoupled from data lines in the first die). Moreover, in some embodiments, the presence of a clock tree in the active interposer may decrease the number of clock sources (e.g., PLLs), which may lead to a uniform synchronization across the entire programmable logic device.

In addition to the clocking tree, the fabric support circuitry may, in certain embodiments, include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die. With this in mind, by including the clocking circuitry in the support circuitry, the first die may entirely or almost entirely contain programmable logic fabric, and the second die may contain all or almost all of the fabric support circuitry that controls the programmable logic fabric.

By way of introduction, FIG. 1 illustrates a block diagram of a system 10 that may employ a programmable logic device 12 that can receive clock signals from clocking circuitry disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

During the design process, the design software 14 may provide tools to test and/or verify timing conditions. Examples of situations that may be tested include racing conditions, register-to-register timing margins, critical timing in data paths, and/or timing closure. To that end, the design software may employ a model of the clocking resources available in the physical die. In programming the programmable logic device. As discussed herein, some of the clocking resources may be disposed in fabric support circuitry, which may be in a die separate from the programmable fabric. Therefore, during the design and compilation process, the design software 14 may take into account the characteristics of the clocking circuitry in the base die.

Figure 2:
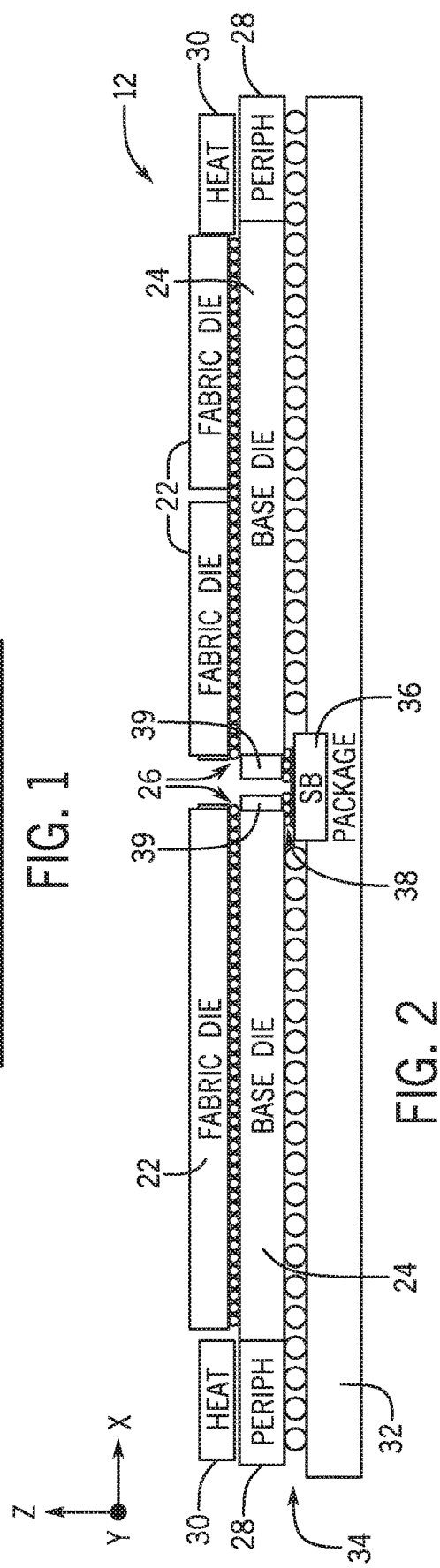
FIG. 2 is a block diagram of a package including the programmable logic device where a fabric die is vertically stacked with a base die, in accordance with an embodiment.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. The fabric die 22 and base die 24 may be connected in a one-to-one relationship and/or a single base die 24 may attach to several fabric die 22, as illustrated in FIG. 2. Moreover, other arrangements, such as one in which several base die 24 may attach to a single fabric die 22, or several base die 24 may attach to several fabric die 22 (e.g., in an interleaved pattern along the x- and/or y-direction) may also be employed. Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components, including the clocking circuitry and the registers described herein.

Figure 3:
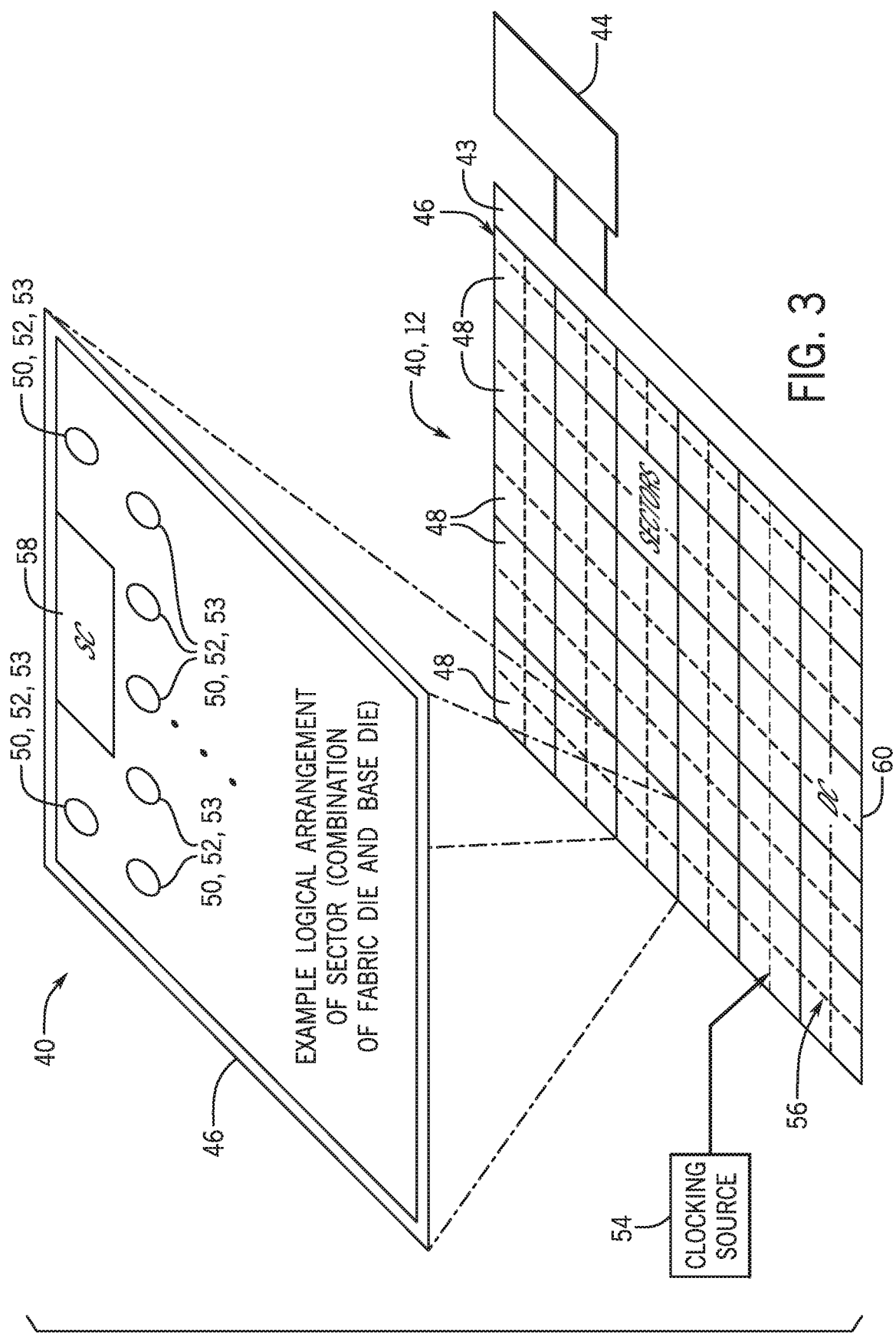
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include a peripheral block 43 that may include interface circuitry to connect to, for example, processing circuitry, external memory, other programmable logic elements, network devices, serial communication interfaces, and programmable circuitry in a different FPGA. The FPGA 40 may also be connected to dedicated transceiver circuitry 44 for driving signals off of the FPGA 40 and for receiving signals from other devices. The transceiver circuitry 44 may be part of the fabric die 22, the base die 24, or a separate die altogether. Interconnection resources 46 may be used to route signals, such as clock or data signals, through the FPGA 40. The FPGA 40 is shown to be sectorized, meaning that programmable logic resources may be distributed through a number of discrete programmable logic sectors 48 (e.g., region, portion). Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions. A clocking terminal 54 may provide synchronized clocking signals to programmable logic elements 50 using a clock distribution network (CDN).

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage), transactions between sector-aligned memory associated with that particular programmable logic sector 48, decrypting configuration data (bitstreams) 18, and locally sequencing reads and writes to implement error detection and correction on the configuration memory 52, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the, and the local controller may be placed into one of these modes. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources may support a wide variety of signals between the device controller 60 and each sector controller 58.

The FPGA 40 may be electrically programmed. With electrical programming arrangements, the programmable logic elements 50 may include one or more logic elements (wires, gates, registers, etc.). For example, during programming, configuration data is loaded into the configuration memory 52 using pins of transceiver circuitry 44 and input/output circuitry in a peripheral block 43. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

Figure 4:
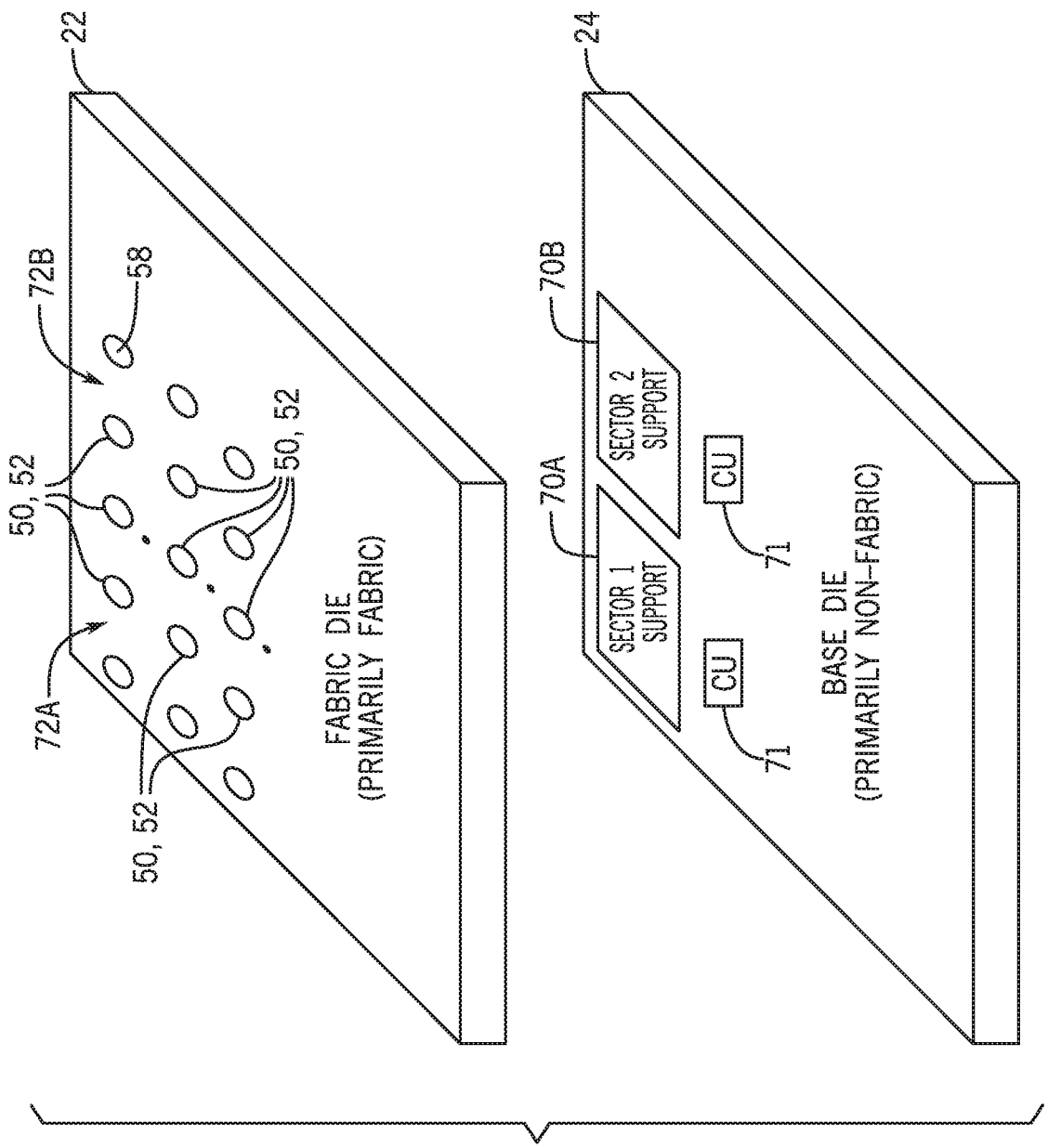
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A, which may provide, among other things, clocking signals to sector 72A of the fabric die 22, and sector 2 support circuitry 70B, which may provide, among other things, clocking signals to sector 72B. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, clocking circuitry including PLLs, DLLs, and clock trees, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 5:
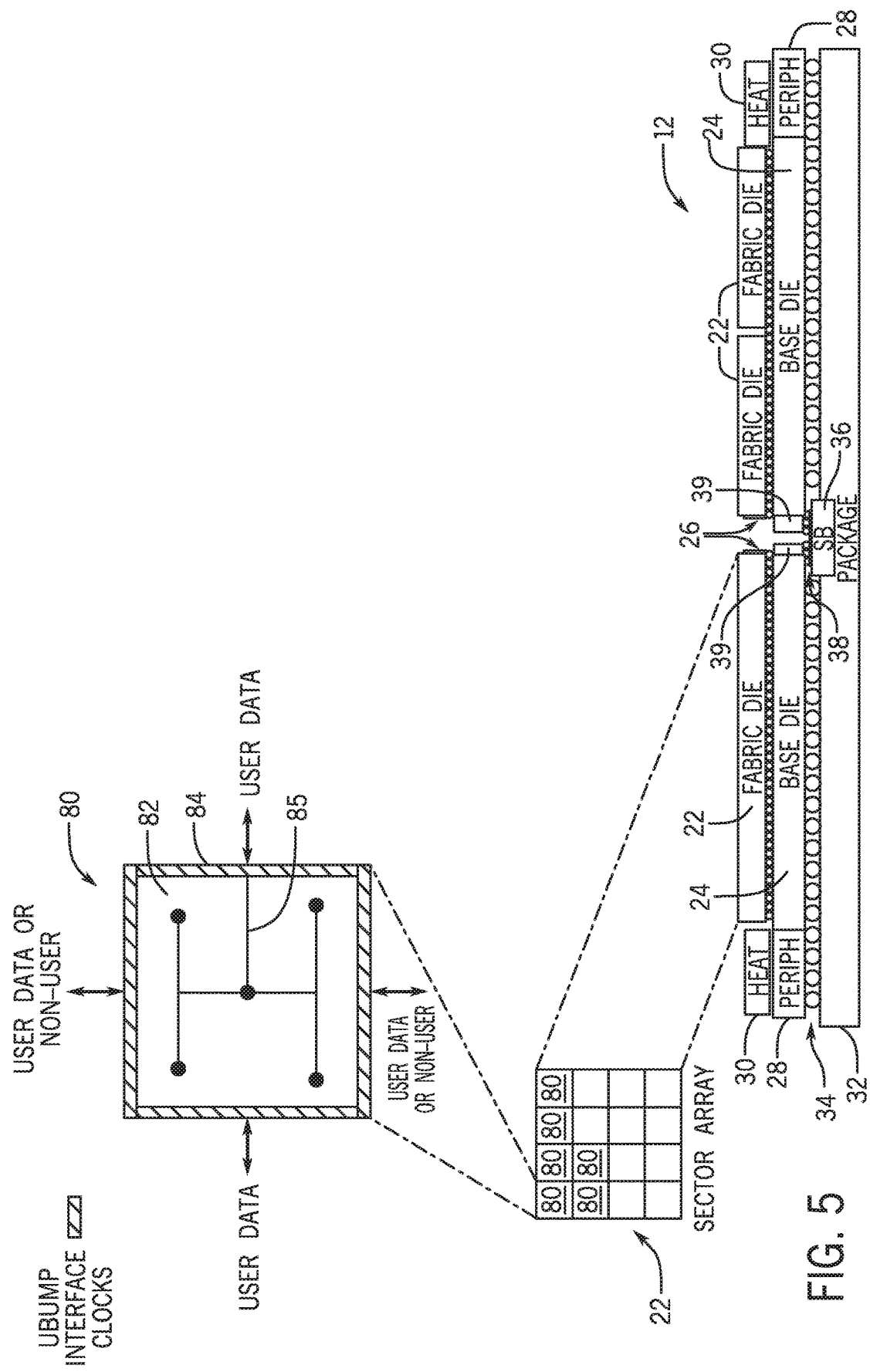
FIG. 5 is a block diagram of an example topology of the fabric die, in accordance with an embodiment.
Figure 6:
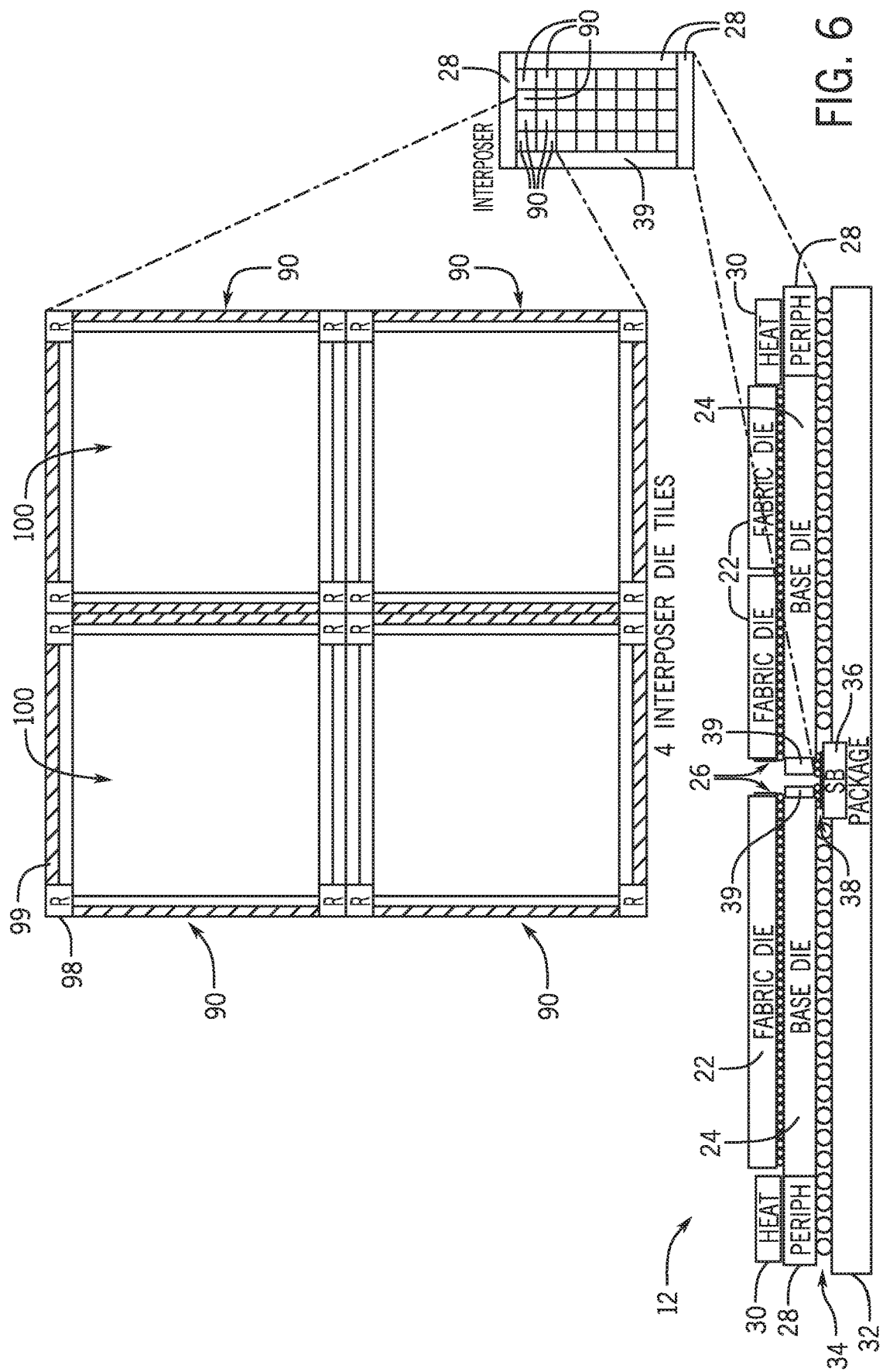
FIG. 6 is a block diagram of an example topology of the base die having an clock tree, in accordance with an embodiment.

One example physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. For example, a clock tree in the base die 24 may provide clock signals to a fabric sector 80 via the interface circuitry 84. A local balanced distribution tree 85 may distribute the clocking signals to the fabric resources 82 in the sector 80. The interface circuitry 84 may connect with a micro-bump (µbump) interface to connect to, among other things, a clock tree in the base die 24.

FIG. 6 provides an example complementary arrangement of the base die 24. The base die 24 may represent an active interposer with several sectors 90 surrounded by peripheral circuitry 28 and the silicon bridge interface 39. Each sector 90 may include a variety of fabric support circuitry, including clocking circuitry, which is illustrated and described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally. By vertically aligning the fabric die 22 and the base die 24, the clock tree circuitry 100 disposed on the base die 24 may physically span across the same surface area of the fabric die 22. In certain embodiments, microbumps may be positioned at various locations between the base die 24 and the fabric die 22 to enable the clock tree circuitry 100 to provide clocking signals from sectors 90 of the base die 24 to sectors 80 of the fabric die 22. Although the data or configuration pathways 99 are illustrated in FIG. 6 as being routed around the sectors 90 of the base die 24, it should be noted that data or configuration pathways 99 of the may be routed across the base die 24 in any suitable manner.

Figure 7:
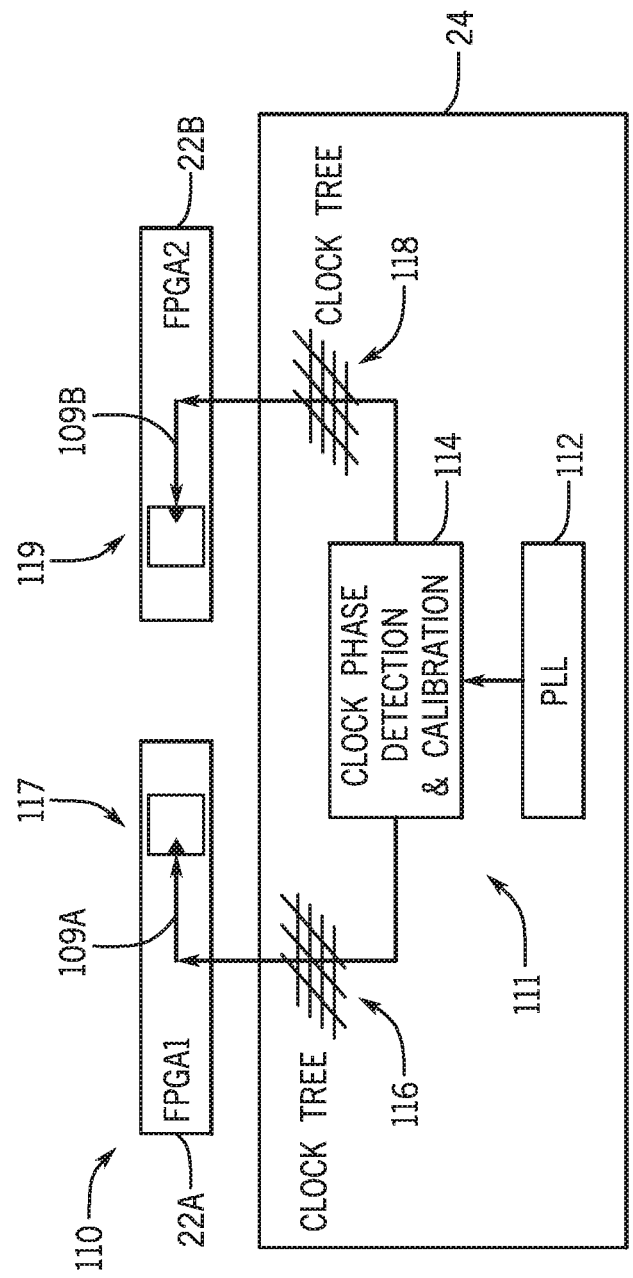
FIG. 7 is a schematic block diagram illustrating a base die having a clock tree that may be used to synchronize registers in two different programmable logic fabric dies, in accordance with an embodiment.

As discussed above, the base die 24 may include clocking circuitry for synchronization of programmable logic elements across a multi-sector and/or a multi-die programmable logic device. A schematic diagram in FIG. 7 illustrates a programmable logic device 110 with clocking circuitry 111 disposed in a base die 24. The clocking circuitry 111 may be used to provide a clock signal 109A to a logic element 117 in a fabric die 22A and a second clock signal 109B to a logic element 119 in a fabric die 22B. The clocking circuitry may include one PLL 112, which may operate as a source for all clocking signals. In some embodiments, the programmable logic device 110 may have a single PLL 112 to provide clocking signals. The use of a single clock source (e.g., PLL 112) for multiple fabric dies (e.g., fabric die 22A and 22B) may a system-synchronous device design. Clocking circuitry 111 may also include phase detection and calibration circuitry 114. Phase detection and calibration circuitry 114 may include one or more DLLs. The phase detection and calibration circuitry 114 may be distributed through the base die 24 and may be used to reduce clock skews across the base die 24. For example, phase detection and calibration circuitry 114 may reduce the skews between clock trees 116 and 118, which are a part of a clock distribution network of the clocking circuitry 111. The reduction in the skews between clock trees 116 and 118 may reduce the potential skews between clocks 190A and 109B. This synchronization may facilitate timing closures during the programming of the FPGA, even in designs that may include a critical timing data transfer between logic elements 117 and 119.

The diagram in FIG. 8 illustrates a programmable logic device 120. The illustrated programmable logic device may have one fabric die 22 coupled to one base die 24. The coupling may take place via a 2.5D or a 3D interface (e.g., microbumps). The fabric die 22 may have a peripheral block 121. The programmable logic device 120 may be a sectorized programmable logic device. In the illustrated example, the programmable logic device 120 may have 16 sectors 80 arranged in a 4×4 array. Each sector 80 may have a sector clock tree 122. In the illustrated example, each sector 80 has 4 clock domains in a 2×2 arrangement. Clock tree 122 may, thus, have four terminal branches arranged in a balanced form. In some embodiments, a sector may have a single clock domain. In such systems, clock tree 122 may be a single branched tree.

Each clock tree 122 may receive a signal from a corresponding DLL 130 in the base die 24. Each DLL 130 may be located in a sector 90 of the base die 24. As discussed above, in some embodiments, a sector 90 of the base die may be under a sector 80 of the fabric die 22. As a result, each sector 80 of the fabric die may be associated with a DLL 130. The base die 24 may also include a PLL 112 that generates the clock signals for the programmable logic device 120. In the illustrated embodiment, the PLL 112 may be disposed under the peripheral block 121. The PLL 112 may provide a clock signal 132 to a balanced clock tree 134. Clock tree 134 may provide clocking signals to the DLLs 130. The DLLs 130 may communicate with neighboring DLLs to equalize skew, through phase detection and calibration. This phase detection and calibration operation, along with the use of the balanced clock tree 134, may lead to a uniform skew throughout the base die 24. In some embodiments, a duty cycle controller 136 may be used to remove duty cycle distortion and further improve skew mitigation across the base die 24. As the sector clock trees 122 in the fabric die 22 are small, the low skew in the base die 24 leads to low skew through the entire fabric die 22.

The diagram in FIG. 9 illustrates a programmable logic device 150. The illustrated programmable logic device 150 may have one fabric die 22 coupled to one base die 24. The coupling may take place via a 2.5D or a 3D interface (e.g., microbumps). The fabric die 22 may have a peripheral block 121. As illustrated in the programmable logic device 120 of FIG. 8, the programmable logic device 150 of FIG. 9 may be a sectorized programmable logic device. In the illustrated example, the programmable logic device 150 may have 16 sectors 80 arranged in a 4×4 array. Each sector 80 may have a sector clock tree 122. In the illustrated example, each sector 80 has 4 clock domains in a 2×2 arrangement. Clock tree 122 may, thus, have four terminal branches arranged in a balanced form. In the programmable logic device 150, the peripheral block 121 performs operations that may benefit from synchronization with sectors 80. To that end, the peripheral block 121 may have a clocking terminal 152 that may receive clocking signals from the base die 24.

Each clock tree 122 may receive a signal from a corresponding DLL 130 in the base die 24. Each DLL 130 may be located in a sector 90 of the base die 24. Moreover, the clocking terminal 152 may receive a clock signal from a DLL 156. The base die 24 may also include a PLL 112 that generates the clock signals for the programmable logic device 120. In the illustrated embodiment, the PLL 112 may be disposed under the peripheral block 121. The PLL 112 may provide a clock signal 132 to a clock tree 154 and to the DLL 156. The DLLs 130 and 156 may communicate with neighboring DLLs to equalize skew, through a phase detection and calibration process. This phase detection and calibration operation, may lead to a uniform skew throughout the base die 24. Therefore, the clock tree 154 may employ unbalanced topologies (e.g., topologies distinct from the H tree topology), as illustrated. Other topologies for clock tree 154 may be used, as the use of DLLs 130 and 156 may compensate skews that may occur due to the use of non-balanced clock tree designs.

Figure 10:
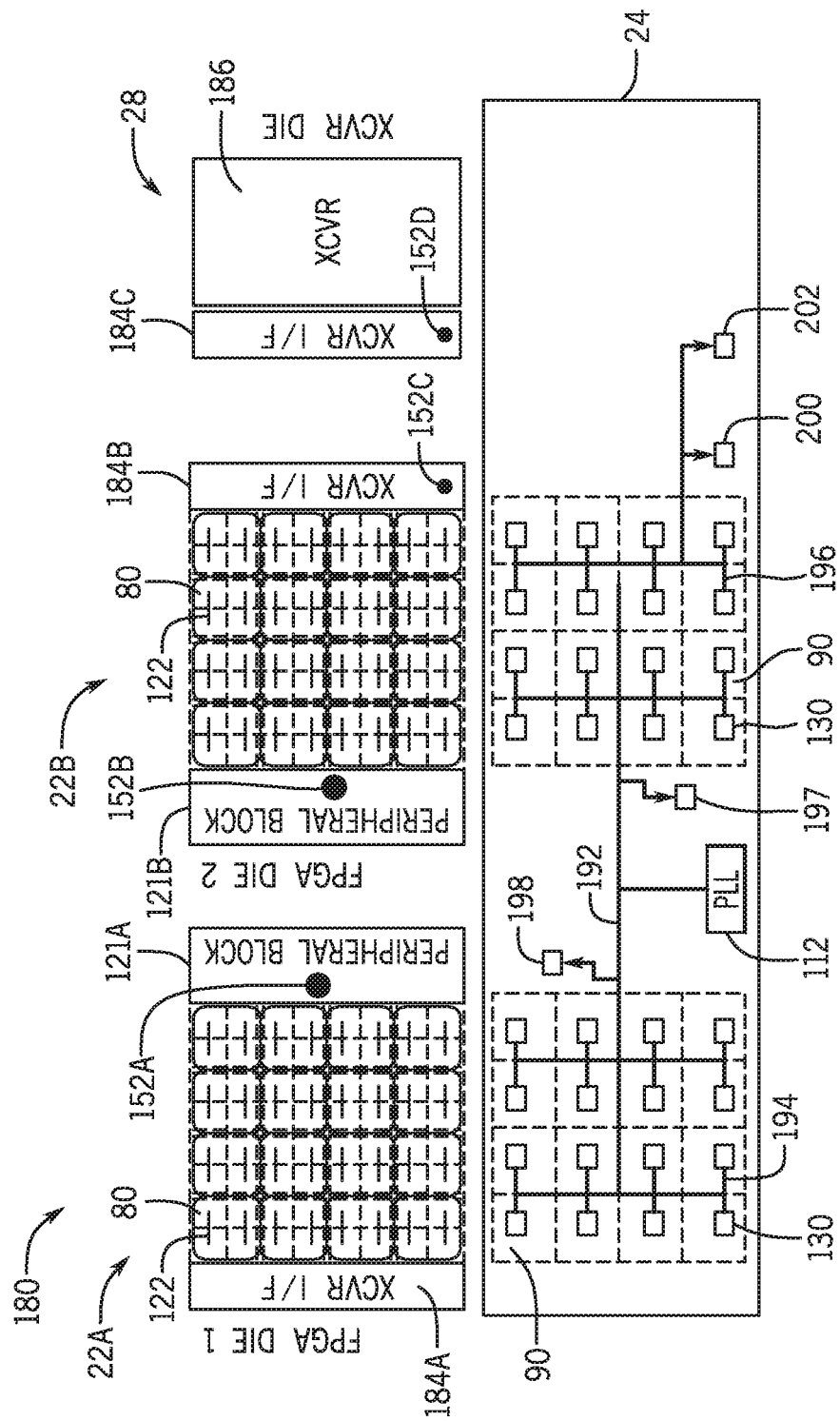
FIG. 10 is a block diagram illustrating a clock tree in a base die that support multiple programmable fabric and/or periphery dies, in accordance with an embodiment.

The diagram in FIG. 10 illustrates a programmable logic device 180. The illustrated programmable logic device 180 may have two fabric dies 22A and 22B, a peripheral die 28, and one base die 24 that are directly coupled to fabric dies 22A, 22B, and to peripheral die 28. The coupling may take place via a 2.5D or a 3D interface (e.g., microbumps). The fabric die 22A may have a peripheral block 121A and a transceiver interface block 184A. The fabric die 22B may have a peripheral block 121B and a transceiver interface block 184B. In the illustrated example, both fabric dies 22A and 22B may be sectorized programmable logic device with 16 sectors 80, each, and arranged in 4×4 arrays. Each sector 80 may have a sector clock tree 122. In the illustrated example, each sector 80 has 4 clock domains in a 2×2 arrangement. Clock trees 122 may, thus, have four terminal branches arranged in a balanced form (e.g., H form). In the programmable logic device 180, the peripheral blocks 121A and 121B, and transceiver interface block 184B may benefit from receiving clock signals synchronized with sectors 80. To that end, the peripheral blocks 121A and 121B may have clocking terminals 152A and 152B, respectively. Moreover, the transceiver interface block 184B may have a clocking terminal 152C. The peripheral die 28 may include transceiver circuitry 186 and a transceiver interface 184C. In the illustrated example, the transceiver interface 184C may benefit from receiving clock signals synchronized with sectors 80 and, thus, may have a clocking terminal 152D. Clock trees 122 and clocking terminals 152A, 152B, 152C, and 152D may receive clocking signals from the base die 24.

Each clock tree 122 may receive a signal from a corresponding DLL 130 in the base die 24. Each DLL 130 may be located in a sector 90 of the base die 24. Moreover, the clocking terminal 152A may receive a clock signal from a DLL 198, clocking terminal 152B may receive a clock signal from a DLL 197, the clocking terminal 152C may receive a clock signal from a DLL 200, and the clocking terminal 152D may receive a clock signal from a DLL 202. The base die 24 may also include a PLL 112 that generates the clock signals for the programmable logic device 120. In the illustrated embodiment, the PLL 112 may be disposed in a bridge region that is not under a die. The PLL 112 may provide a clock signal 192 to clock trees 194 and 196, and to the DLLs 197, 198, 200, and 202. The DLLs 130, 197, 198, 200, and 202 may communicate with neighboring DLLs to equalize skew, through a phase detection and calibration process. This phase detection and calibration operation, may lead to a uniform skew throughout the base die 24. As a result, skews between clock trees 194 and 196 may be minimized, resulting in reduced skews between logic elements in the fabric die 22A and 22B. More generally, the uniform skew throughout the base die 24 mitigates skews between circuitries in fabric die 22A, fabric die 22B, and peripheral die 28.

Figure 12:
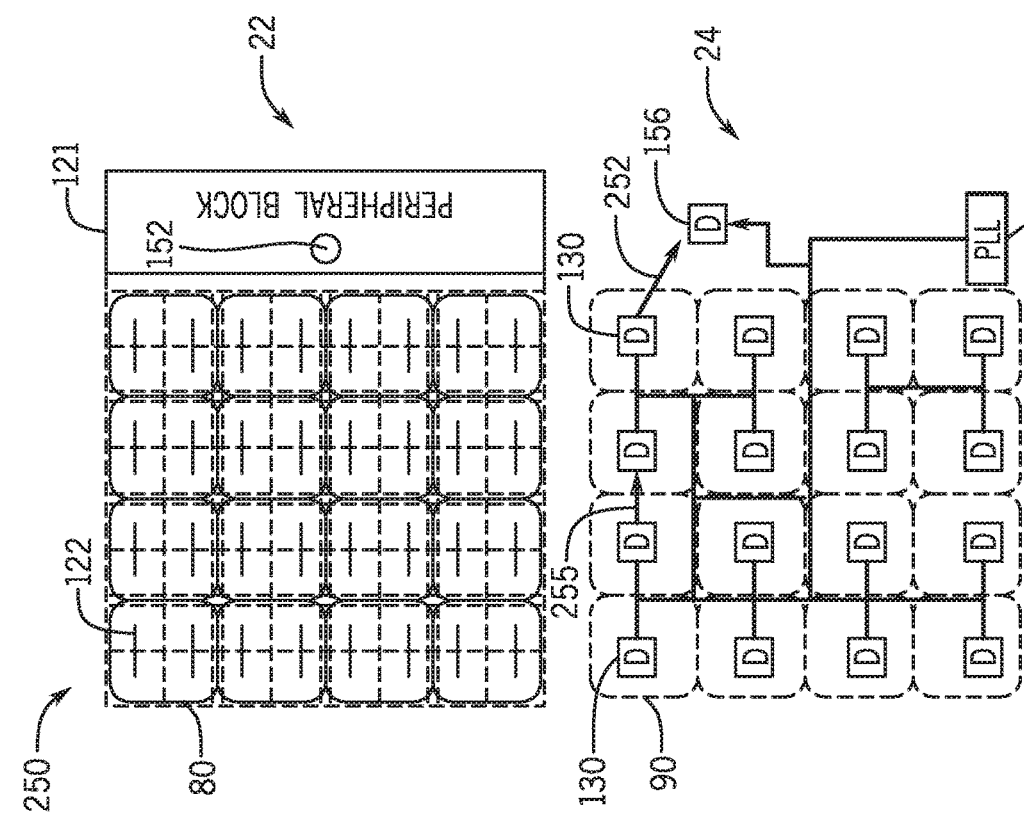
FIG. 12 is a schematic block diagram illustrating synchronization within a clock tree between neighboring nodes in a clock tree, in accordance with an embodiment.

As discussed above, neighboring clock DLLs may be DLLs may communicate to equalize skew. The diagram of a programmable logic device 250 in FIG. 12 illustrates the communication that may take place between DLLs in a base die. The illustrated programmable logic device 250 may have one fabric die 22 coupled to one base die 24. The coupling may take place via a 2.5D or a 3D interface (e.g., microbumps). The fabric die 22 may have a peripheral block 121. As illustrated in the programmable logic device 150 of FIG. 9, the programmable logic device 250 of FIG. 12 may be a sectorized programmable logic device arranged in a 4×4 array. Each sector 80 may have a sector clock tree 122 which, in the illustrated example, is configured in a 2×2 arrangement. In the programmable logic device 250, the peripheral block 121 may have a clocking terminal 152 that may receive clocking signals from the base die 24. Each clock tree 122 may receive a signal from a corresponding DLL 130 in the base die 24 and the clocking terminal 152 may receive a clock signal from a DLL 156. The base die 24 may also include a PLL 112 that generates the clock signals for the programmable logic device 250. In the illustrated embodiment, the PLL 112 may be disposed under the peripheral block 121. A DLL 130 may synchronize with neighboring DLLs by feeding its clock signal (e.g., its output clock signal) as sense clock to a neighboring DLL 130. An example of this communication is illustrated by sense clock 251, between DLLs 130. The DLL 156, associated with the peripheral block 121, may also be synchronized to a sector DLLs 130, as illustrated by sense clock 252. In a design such as the one illustrated in FIG. 12, the clock skew (e.g., clock error) may become independent of the specific implementation or the routing of the clock tree in the base die.

Figure 13:
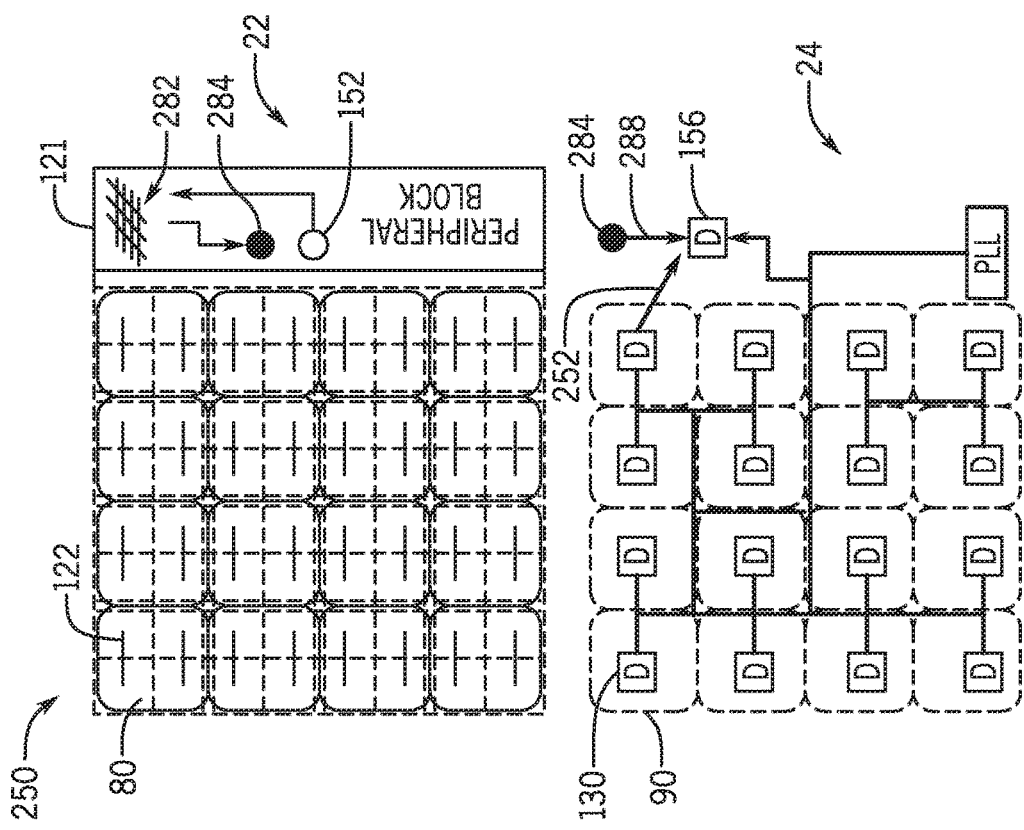
FIG. 13 is a schematic block diagram illustrating synchronization within a clock tree of the base die using feedback from the fabric die, in accordance with an embodiment.

In some embodiments, such as when the peripheral local clock tree (e.g., clock tree 122) has different topologies in different sectors, or when the clocking in the peripheral block 121 may generate skew, a clock signal from the fabric die 22 may be used as feedback. The diagram of a programmable logic device 280 in FIG. 13 illustrates a synchronization using a feedback clock from the fabric die. The illustrated programmable logic device 250 may have one fabric die 22 coupled to one base die 24. The coupling may take place via a 2.5D or a 3D interface (e.g., microbumps). The fabric die 22 may have a peripheral block 121. As illustrated in the programmable logic device 150 of FIG. 9, the programmable logic device 280 of FIG. 13 may be a sectorized programmable logic device arranged in a 4×4 array. Each sector 80 may have a sector clock tree 122 which, in the illustrated example, is configured in a 2×2 arrangement. In the programmable logic device 280, the peripheral block 121 may have a clocking terminal 152 that may receive clocking signals from the base die 24. The clocking terminal 152 may generate clock signals for a local clock tree 282. As discussed above, each clock tree 122 may receive a signal from a corresponding DLL 130 in the base die 24 and the clock tree 152 may receive a clock signal from a DLL 156 via the clocking terminal 152. The clock tree 152 may generate a return clock signal 288 to clocking terminal 284 to the base die. The return clock signal may be a clock signal at an end branch of the clock tree 282. As illustrated, the return clock signal 282 may be used in combination with the sense clock 252. In a design such as the one illustrated in FIG. 14, the clock skew (e.g., clock error) may be minimized when the local clock trees 122 and/or 282 may have different routing implementations.

In the detailed examples, each sector had a DLL element, thus mitigating sector-to-sector skew. However, due to the resource usage for DLLs, some embodiments may have multiple sectors sharing a DLL element. Moreover, in the detailed examples, each sector was arranged in four clocking domains using a 2×2 arrangement, which may lead to some residual skews. In some embodiments, a sector may be assigned to four DLLs with one DLL for each clock domain. Such implementation may allow a 1×1 arrangement, which may further reduce any potential skews. It should further be noted that the placement of the DLL in a base die may allow placement of the DLL directly under a center of the sector (e.g., the center of the 2×2 arrangement). Such placement may substantially increase synchronization and decreasing timing margin requirements. It should also be noted that the use of clock tree circuitry in the base die may improve the functionality of legacy circuitry by making the legacy circuitry less susceptible to on-chip variations. As a result, embodiments herein may allow low jitter clock tree implementations. The improvement in timing closure and reduction in the timing margin requirements may allow an increase in the frequency of operation for the programming logic device, which accelerate the operations of electronic devices coupled to or employing the programmable logic device as an accelerator or processing circuitry.

Figure 11:
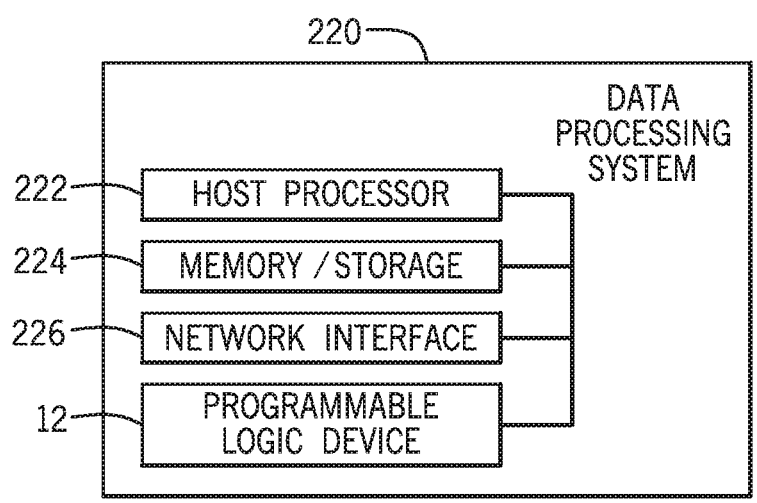
FIG. 11 is a block diagram of a data processing system that may use the programmable logic device to rapidly respond to data processing requests, in accordance with an embodiment.

The programmable logic device 12 may be, or may be a component of, a data processing system. For example, the programmable logic device 12 may be a component of a data processing system 220, shown in FIG. 11. The data processing system 220 includes a host processor 222, memory and/or storage circuitry 224, and a network interface 226. The data processing system 220 may include more or fewer components (e.g., electronic display, user interface structures, application specific integrated circuits (ASICs)). The host processor 222 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 220 (e.g., to perform machine learning, video processing, voice recognition, image recognition, data compression, database search ranking, bioinformatics, network security pattern identification, spatial navigation, or the like). The memory and/or storage circuitry 224 may include random access memory (RAM), read-only memory (ROM), one or more hard drives, flash memory, or the like. The memory and/or storage circuitry 224 may be considered external memory to the programmable logic device 12 and may hold data to be processed by the data processing system 220. In some cases, the memory and/or storage circuitry 224 may also store configuration programs (bitstreams) for programming the programmable logic device 12. The network interface 226 may allow the data processing system 220 to communicate with other electronic devices. The data processing system 220 may include several different packages or may be contained within a single package on a single package substrate.

In one example, the data processing system 220 may be part of a data center that processes a variety of different requests. For instance, the data processing system 220 may receive a data processing request via the network interface 226 to perform machine learning, video processing, voice recognition, image recognition, data compression, database search ranking, bioinformatics, network security pattern identification, spatial navigation, or some other specialized task. The host processor 222 may cause the programmable logic fabric of the programmable logic device 12 to be programmed with a particular accelerator related to requested task. For instance, the host processor 222 may instruct that configuration data (bitstream) stored on the memory/storage 224 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 260 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An electronic device, comprising:
    a logic die, comprising a plurality of logic elements; and
    a base die directly coupled to the logic die via an interface, wherein the base die comprises:
        a phase-locked loop configured to generate a first clock signal;
        phase detection and calibration circuitry coupled to the phase-locked loop, wherein the phase detection and calibration circuitry is configured to:
            receive the first clock signal from the phase-locked loop;
            generate a second clock signal and a third clock signal based on the first clock signal;
            reduce skew between the second clock signal and the third clock signal in the base die;
            provide the second clock signal to a first clock tree; and
            provide the third clock signal to a second clock tree;
        the first clock tree configured to transmit the second clock signal to a first logic element of the plurality of logic elements via a first connection of the interface; and
        the second clock tree configured to transmit the third clock signal to a second logic element of the plurality of logic elements via a second connection of the interface.

2. The electronic device of claim 1, wherein the logic die comprises programmable fabric, and wherein the first logic element and the second logic element comprises a programmable logic element.

3. The electronic device of claim 1, wherein the interface comprises a 2.5D interface or a 3D interface.

4. The electronic device of claim 1, wherein the interface comprises microbumps.

5. The electronic device of claim 1, wherein the phase detection and calibration circuitry comprises:
    a first delay-locked loop configured to receive the first clock signal and generate the second clock signal; and
    a second delay-locked loop configured to receive the first clock signal and generate the third clock signal.

6. The electronic device of claim 1, comprising a second logic die comprising a second plurality of logic elements directly coupled to the base die via a second interface, wherein the phase detection and calibration circuitry is configured to provide a fourth clock signal based on the first clock signal to a third clock tree, and wherein the third clock tree is configured to transmit the fourth clock signal to a third logic element of the second plurality of logic elements via the second interface.

7. The electronic device of claim 1, comprising a peripheral die directly coupled to the base die via a second interface, and wherein the phase detection and calibration circuitry is configured to provide a fourth clock signal based on the first clock signal to a clocking terminal of the peripheral die.

8. The electronic device of claim 1, comprising a data processing system comprising the logic die and the base die.

9. The electronic device of claim 8, wherein the data processing system is configured to perform machine learning, video processing, voice recognition, image recognition, data compression, database search ranking, bioinformatics, network security pattern identification, spatial navigation, or any combination thereof.

10. A programmable logic device comprising:
    a plurality of sectors comprising:
        a first sector comprising:
            a first plurality of programmable logic elements; and
            a first clock tree; and a second sector comprising:
  a second plurality of programmable logic elements; and
  a second clock tree; and
an interface, wherein the first clock tree is configured to receive a first clock signal from a base die through a first connection of the interface, wherein the second clock tree is configured to receive a second clock signal from the base die through a second connection of the interface, and wherein the base die comprises:
  a phase-locked loop configured to generate a third clock signal;
  phase detection and calibration circuitry coupled to the phase-locked loop, wherein the phase detection and calibration circuitry is configured to:
    receive the third clock signal from the phase-locked loop; and
    generate the first clock signal configured to be transmitted to the first clock tree based on the third clock signal and the second clock signal configured to be transmitted to the second clock tree based on the third clock signal; and
    reduce skew between the first clock signal and the second clock signal in the base die.

11. The programmable logic device of claim 10, wherein the first sector comprises a first set of four clocking domains and the second sector comprises a second set of four clocking domains, wherein the first clock tree comprises a first set of four terminal branches, wherein each of the first set of four terminal branches are coupled to a first respective clocking domain of the first set of four clocking domains, and wherein the second clock tree comprises a second set of four terminal branches, and wherein each of the second set of four terminal branches are coupled to a second respective clocking domain of the second set of four clocking domains.

12. The programmable logic device of claim 10, wherein the interface comprises a 2.5D interface or a 3D interface.

13. The programmable logic device of claim 10, comprising a peripheral block configured to receive a fourth clock signal from the base die through a third connection of the interface.

14. The programmable logic device of claim 13, wherein the peripheral block comprises a transceiver.

15. The programmable logic device of claim 10, wherein the first connection and the second connection of the interface each comprises a microbump configured to couple the programmable logic device to the base die.

16. A first integrated circuit comprising:
a first clock tree and a second clock tree;
a clock source comprising a phase-locked loop;
phase detection and calibration circuitry coupled to the phase-locked loop, wherein the phase detection and calibration circuitry is configured to:
  receive a first clock signal from the phase-locked loop;
  generate a second clock signal and a third clock signal based on the first clock signal;
  reduce skew between the second clock signal and the third clock signal in the first integrated circuit;
  provide the second clock signal to the first clock tree; and
  provide the third clock signal to the second clock tree; and
a first interface configured to couple to a second integrated circuit, wherein the first interface comprises:
  a first connection configured to transmit the second clock signal from the first clock tree and to the second integrated circuit; and
  a second connection configured to transmit the third clock signal from the first clock tree to the second integrated circuit.

17. The first integrated circuit of claim 16, wherein the first connection comprises a 2.5D interface or a 3D interface.

18. The first integrated circuit of claim 16, wherein the phase detection and calibration circuitry comprises a first delay-locked loop configured to couple to the first connection and a second delay-locked loop configured to couple to the second connection.

19. The first integrated circuit of claim 16, comprising a second interface configured to couple to a third integrated circuit, the second interface comprising a third connection configured to transmit a fourth clock signal from a third clock tree of the first integrated circuit to the third integrated circuit, wherein the third clock tree is configured to receive the first clock signal.

20. The first integrated circuit of claim 16, comprising a duty cycle controller configured to correct a duty cycle distortion in the first clock tree.

21. The first integrated circuit of claim 16, wherein the first clock tree comprises an H tree topology.

22. The first integrated circuit of claim 16, wherein the first connection comprises a microbump.

* * * * *